(12) United States Patent
Hirata

(10) Patent No.: US 10,586,819 B2
(45) Date of Patent: Mar. 10, 2020

(54) SOLID-STATE IMAGING DEVICE AND ELECTRONIC APPARATUS INCLUDING DRIVER CONTROL CIRCUITS FOR DRIVING MULTIPLE PIXEL ROWS

(71) Applicant: SONY CORPORATION, Tokyo (JP)

(72) Inventor: Eiji Hirata, Tokyo (JP)

(73) Assignee: SONY CORPORATION, Tokyo (JP)

( * ) Notice: Subject to any disclaimer, the term of this patent is extended or adjusted under 35 U.S.C. 154(b) by 10 days.

(21) Appl. No.: 15/524,200

(22) PCT Filed: Oct. 29, 2015

(86) PCT No.: PCT/JP2015/080484
§ 371 (c)(1),
(2) Date: May 3, 2017

(87) PCT Pub. No.: WO2016/076126
PCT Pub. Date: May 19, 2016

(65) Prior Publication Data
US 2017/0338262 A1    Nov. 23, 2017

(30) Foreign Application Priority Data

Nov. 12, 2014  (JP) ................. 2014-229758

(51) Int. Cl.
*H04N 5/335*     (2011.01)
*H01L 27/146*    (2006.01)
*H04N 5/3745*    (2011.01)
*H04N 5/341*     (2011.01)
*H04N 5/374*     (2011.01)
*H04N 5/378*     (2011.01)

(52) U.S. Cl.
CPC .. *H01L 27/14609* (2013.01); *H01L 27/14641* (2013.01); *H01L 27/14643* (2013.01); *H04N 5/341* (2013.01); *H04N 5/374* (2013.01); *H04N 5/378* (2013.01); *H04N 5/3745* (2013.01)

(58) Field of Classification Search
CPC ... H01L 27/14609; H04N 5/374; H04N 5/378
USPC ........................................................ 348/308
See application file for complete search history.

(56) References Cited

U.S. PATENT DOCUMENTS

2011/0242351 A1*  10/2011  Shoji ................... H01L 27/1464
                                                                 348/222.1

FOREIGN PATENT DOCUMENTS

| JP | 2011-211455 A | 10/2011 |
| JP | 2013-55589 A  | 3/2013  |
| JP | 2013-150304 A | 8/2013  |

(Continued)

OTHER PUBLICATIONS

International Search Report prepared by the Japan Patent Office dated Dec. 1, 2015, for International Application No. PCT/JP2015/080484.

*Primary Examiner* — Usman A Khan
(74) *Attorney, Agent, or Firm* — Sheridan Ross P.C.

(57) ABSTRACT

The present technology relates to a solid-state imaging device and an electronic apparatus that can increase the theoretical yield of a chip. A pixel array is formed with pixels arranged in a matrix. A drive control unit is provided for each set of pixel rows in the pixel array. The drive control unit operates to simultaneously drive the pixels included in the set of pixel rows. The present technology can be applied to a CMOS image sensor including A/D converter circuits for each column in a pixel array.

10 Claims, 12 Drawing Sheets

(56) References Cited

FOREIGN PATENT DOCUMENTS

| JP | 2014-72788 A | 4/2014 |
|---|---|---|
| JP | 2015-70591 A | 4/2015 |
| WO | WO 2010/084695 A1 | 7/2010 |

* cited by examiner

SOLID-STATE IMAGING DEVICE AND ELECTRONIC APPARATUS INCLUDING DRIVER CONTROL CIRCUITS FOR DRIVING MULTIPLE PIXEL ROWS

CROSS REFERENCE TO RELATED APPLICATIONS

This application is a national stage application under 35 U.S.C. 371 and claims the benefit of PCT Application No. PCT/JP2015/080484 having an international filing date of 29 Oct. 2015, which designated the United States, which PCT application claimed the benefit of Japanese Patent Application No. 2014-229758 filed 12 Nov. 2014, the disclosures of which are incorporated herein by reference in their entirety.

TECHNICAL FIELD

The present technology relates to solid-state imaging devices and electronic apparatuses, and more particularly, to a solid-state imaging device and an electronic apparatus that can increase the theoretical yield of a chip.

BACKGROUND ART

There have been solid-state imaging devices each having analog/digital (A/D) converter circuits provided for each column in a pixel array (see Patent Document 1, for example).

In a solid-state imaging device having such a configuration, vertical selection circuits are designed to operate for the respective rows in the pixel array.

CITATION LIST

Patent Document

Patent Document 1: Japanese Patent Application Laid-Open No. 2013-55589

SUMMARY OF THE INVENTION

Problems to be Solved by the Invention

In the above described configuration, however, when pixels in multiple pixel rows are simultaneously driven, the vertical selection circuits corresponding to the respective pixel rows perform similar operations at the same time.

The present technology has been developed in view of those circumstances, and is to increase the theoretical yields of chips.

Solutions to Problems

A solid-state imaging device of one aspect of the present technology includes: a pixel array formed with pixels arranged in a matrix; and a drive control unit that is provided for each set of pixel rows and operates to simultaneously drive pixels included in the set of pixel rows.

The drive control unit may be provided for each set of shared pixel rows, and operate to simultaneously drive each shared pixel in the set of shared pixel rows.

The solid-state imaging device may further include a driver that is provided for each set of shared pixel rows and drives each shared pixel in the set of shared pixel rows in accordance with a signal from the drive control unit.

The drive control unit may supply the driver with a signal for driving at least one of the pixels constituting the shared pixel.

The solid-state imaging device may further include: a selection circuit that is provided for each shared pixel row and determines whether to output a signal from the drive control unit; and a driver that is provided for each shared pixel row and drives each shared pixel in the shared pixel row in accordance with the signal from the selection circuit.

The selection circuit may supply the driver with a signal for driving at least one of the respective pixels constituting the shared pixel.

The drive control unit may supply the signal to the selection circuits of the shared pixel rows included in the set of shared pixel rows, and to the selection circuit of a shared pixel row included in another set of shared pixel rows.

The solid-state imaging device may further include a driver that is provided for each set of pixel rows and simultaneously drives the respective pixels in the set of pixel rows in accordance with a signal from the drive control unit.

The solid-state imaging device may further include: a selection circuit that is provided for each pixel row and determines whether to output a signal from the drive control unit; and a driver that is provided for each pixel row and drives each pixel in the pixel row in accordance with the signal from the selection circuit. In this solid-state imaging device, the drive control unit may supply the signal to the selection circuits of the pixel rows included in the set of pixel rows, and to the selection circuit of a pixel row included in another set of pixel rows.

The solid-state imaging device may further include an A/D converter circuit provided for each column in the pixel array, the number of the A/D converter circuits being the same as the number of the pixel rows to be simultaneously driven by an operation of the drive control unit.

The solid-state imaging device may have a stack structure formed by stacking a first substrate having the pixel array formed therein and a second substrate having a circuit including the drive control unit formed therein.

An electronic apparatus of one aspect of the present technology includes a solid-state imaging device that includes: a pixel array formed with pixels arranged in a matrix; and a drive control unit that is provided for each set of pixel rows and simultaneously drives the respective pixels in the set of pixel rows.

In one aspect of the present technology, the respective pixels in a set of pixel rows are simultaneously driven in a pixel array formed with pixels arranged in a matrix.

Effects of the Invention

According to one aspect of the present technology, the theoretical yield of a chip can be increased.

MODES FOR CARRYING OUT THE INVENTION

The following is a description of embodiments of the present technology, with reference to the drawings.

Example Configuration of a CMOS Image Sensor

Figure 1:
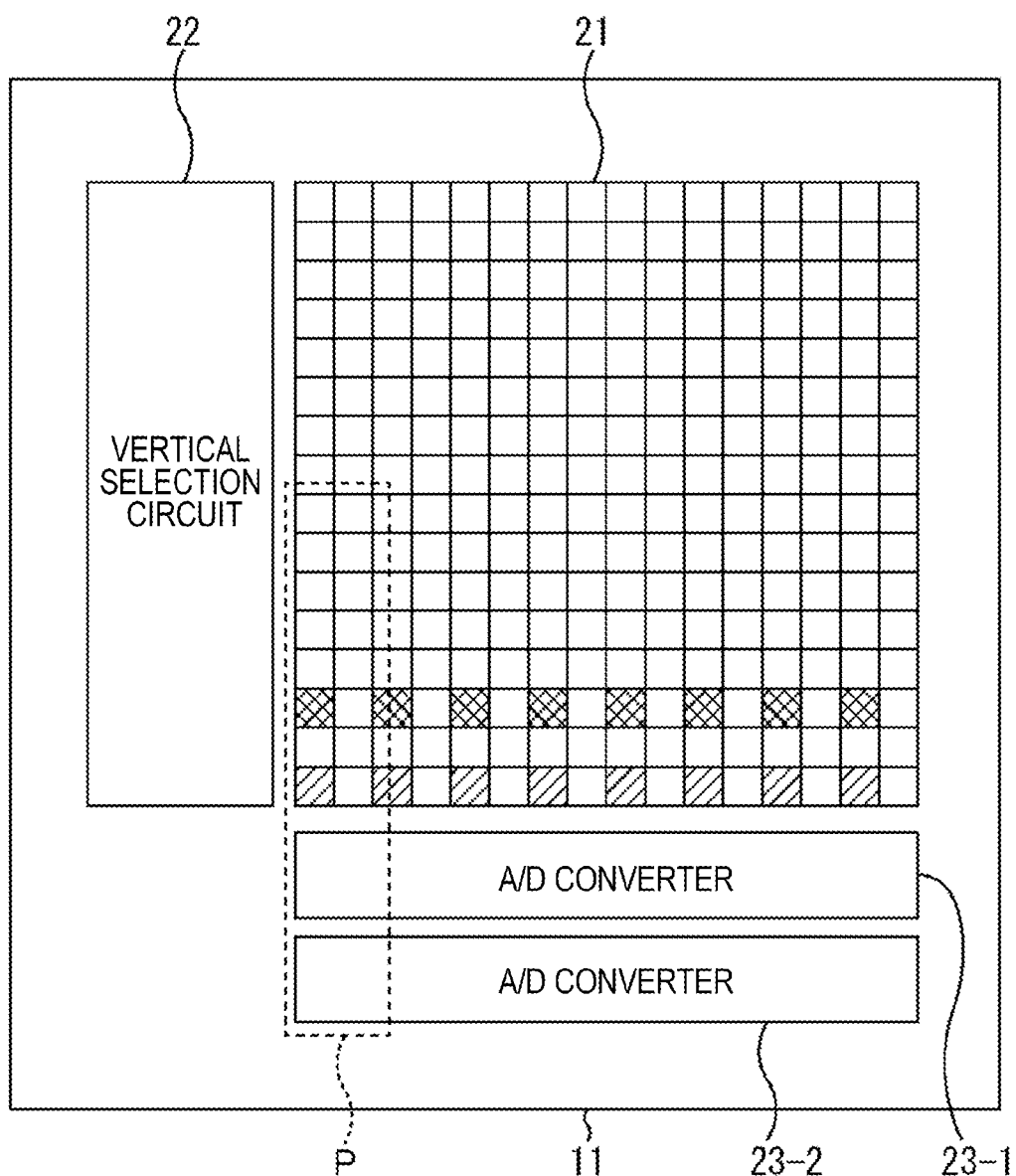
FIG. 1 is a block diagram showing a typical example configuration of a CMOS image sensor.

FIG. 1 is a diagram showing a typical example configuration of a complementary metal oxide semiconductor (CMOS) image sensor. The CMOS image sensor 11 shown in FIG. 1 is an example of a solid-state imaging device to which the present technology is applied. The present technology may of course be applied to image sensors having other configurations.

The CMOS image sensor 11 includes a pixel array 21, a vertical selection circuit 22, and A/D converters 23-1 and 23-2. These components are formed on a semiconductor substrate (a chip) that is not shown in the drawing.

In the CMOS image sensor 11, light incident on the pixel array 21 is photoelectrically converted, and pixel signals are read from the respective pixels of the pixel array 21 driven by the vertical selection circuit 22. The read pixel signals (analog signals) are then subjected to A/D conversion by the A/D converters 23-1 and 23-2, and digital data corresponding to the incident light is output.

The pixel array 21 is formed with unit pixels 51 arranged in a matrix. The unit pixels 51 each includes a photoelectric conversion element such as a photodiode. The number of the unit pixels 51 disposed in the pixel array 21 may be set as appropriate, and the number of rows and the number of columns may be set as appropriate. In the description below, the unit pixels 51 will be referred to simply as the pixels 51.

The vertical selection circuit 22 drives the respective pixels 51 in the pixel array 21 on a row basis. Specifically, the vertical selection circuit 22 simultaneously drives the pixels 51 of multiple pixel rows. Control lines (not shown) that extend from the vertical selection circuit 22 to the respective rows in the pixel array 21 are formed.

The A/D converters 23-1 and 23-2 perform A/D conversion on analog pixel signals read from the respective pixels 51 of the respective columns in the pixel array 21. The A/D converters 23-1 and 23-2 include column A/D converter circuits provided for the respective columns in the pixel array 21.

In a conventional pixel array, a vertical signal line for supplying pixel signals to the column A/D converter circuit is provided for each column. In the case of the pixel array 21, two vertical signal lines are provided for each column. Then, the pixels of one column are alternately connected to the two vertical signal lines at intervals of a predetermined number of rows. Pixel signals output to the respective vertical signal lines are supplied to the respective column A/D converter circuits in the A/D converters 23-1 and 23-2.

Example Configuration of the Pixels

Figure 2:
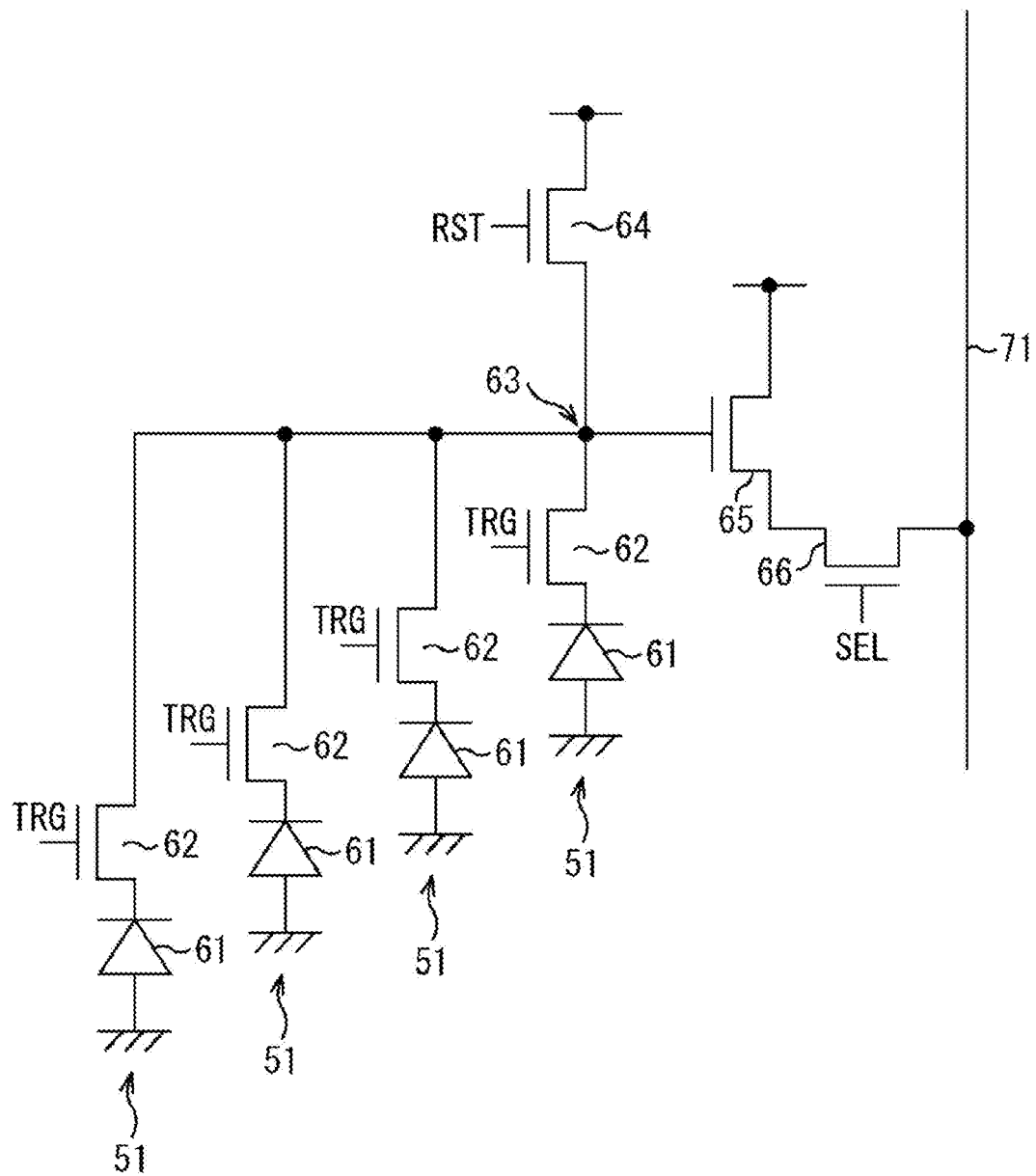
FIG. 2 is a circuit diagram showing an example configuration of a pixel.

Referring now to FIG. 2, an example configuration of the pixels 51 disposed in the pixel array 21 is described. It should be noted that sharing among four pixels 51 consisting of two vertically aligned pixels and two horizontally aligned pixels is designed in the pixel array 21.

The pixels 51 each include a photodiode (PD) 61 as a photoelectric conversion unit, a transfer transistor 62, a floating diffusion (FD) 63, a reset transistor 64, an amplifying transistor 65, and a select transistor 66. Of these components, the FD 63, the reset transistor 64, the amplifying transistor 65, and the select transistor 66 are shared among the four pixels 51.

In each of the pixels 51, the anode of the PD 61 is grounded, and the cathode of the PD 61 is connected to the source of the transfer transistor 62. The drain of the transfer transistor 62 of each of the pixels 51 is connected to the gate of a single amplifying transistor 65, and this connecting point forms the FD 63.

The reset transistor 64 is connected between a predetermined power supply and the FD 63. The drain of the amplifying transistor 65 is connected to a predetermined power supply, and the source of the amplifying transistor 65 is connected to the drain of the select transistor 66. The source of the select transistor 66 is connected to a vertical signal line 71.

Drive signals TRG, RST, and SEL are supplied to the gates of the four transfer transistors 62, the reset transistor 64, and the select transistor 66, respectively, via control lines from the vertical selection circuit 22.

<Reading from Pixels>

Figure 3:
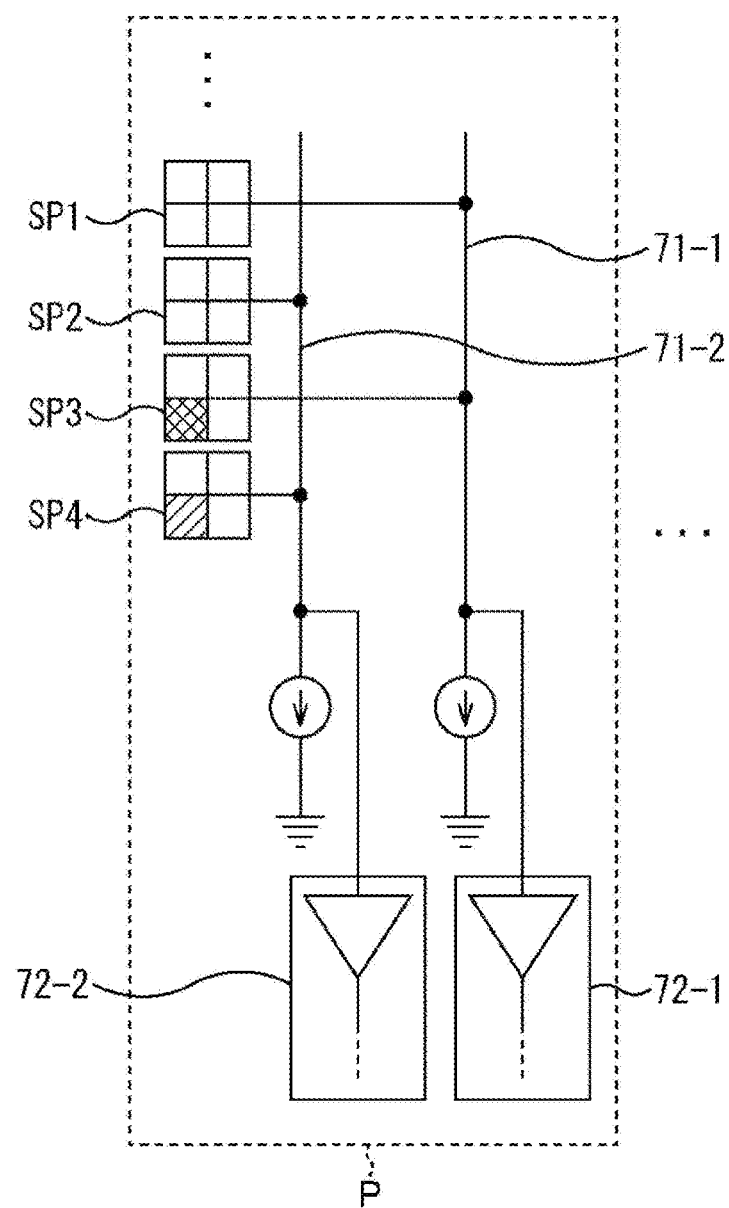
FIG. 3 is a diagram for explaining simultaneous driving of pixels.

Referring now to FIG. 3, reading of pixel signals from pixels shared as described above is explained.

FIG. 3 shows the specific configuration of the portion surrounded a frame P drawn with a dashed line in the CMOS image sensor 11 shown in FIG. 1.

In the shared pixel column shown in FIG. 3, the respective shared pixels are alternately connected to two vertical signal lines 71-1 and 71-2 at intervals of one shared pixel row.

Specifically, shared pixels SP1 and SP3 are connected to the vertical signal line 71-1. Pixel signals that are output from the shared pixels SP1 and SP3 to the vertical signal line 71-1 are supplied to a comparison unit and a column A/D converter circuit 72-1 formed with a counter or the like (not shown). The column A/D converter circuit 72-1 is provided in the A/D converter 23-1.

Meanwhile, shared pixels SP2 and SP4 are connected to the vertical signal line 71-2. Pixel signals that are output from the shared pixels SP2 and SP4 to the vertical signal line 71-2 are supplied to a comparison unit and a column A/D converter circuit 72-2 formed with a counter or the like (not shown). The column A/D converter circuit 72-2 is provided in the A/D converter 23-2.

In such a configuration, the shared pixels of two shared pixel rows are to be simultaneously driven. For example, at a certain time, the shared pixels of the shared pixel row including the shared pixel SP1 and the shared pixel row including the shared pixel SP2 are simultaneously driven. At another certain time, the shared pixels of the shared pixel row including the shared pixel SP3 and the shared pixel row including the shared pixel SP4 are also simultaneously driven.

In this case, in the vertical selection circuit 22, the components corresponding to the respective shared pixel rows to be simultaneously driven perform similar operations at the same time.

Example Configuration of a Conventional Vertical Selection Circuit

Figure 4:
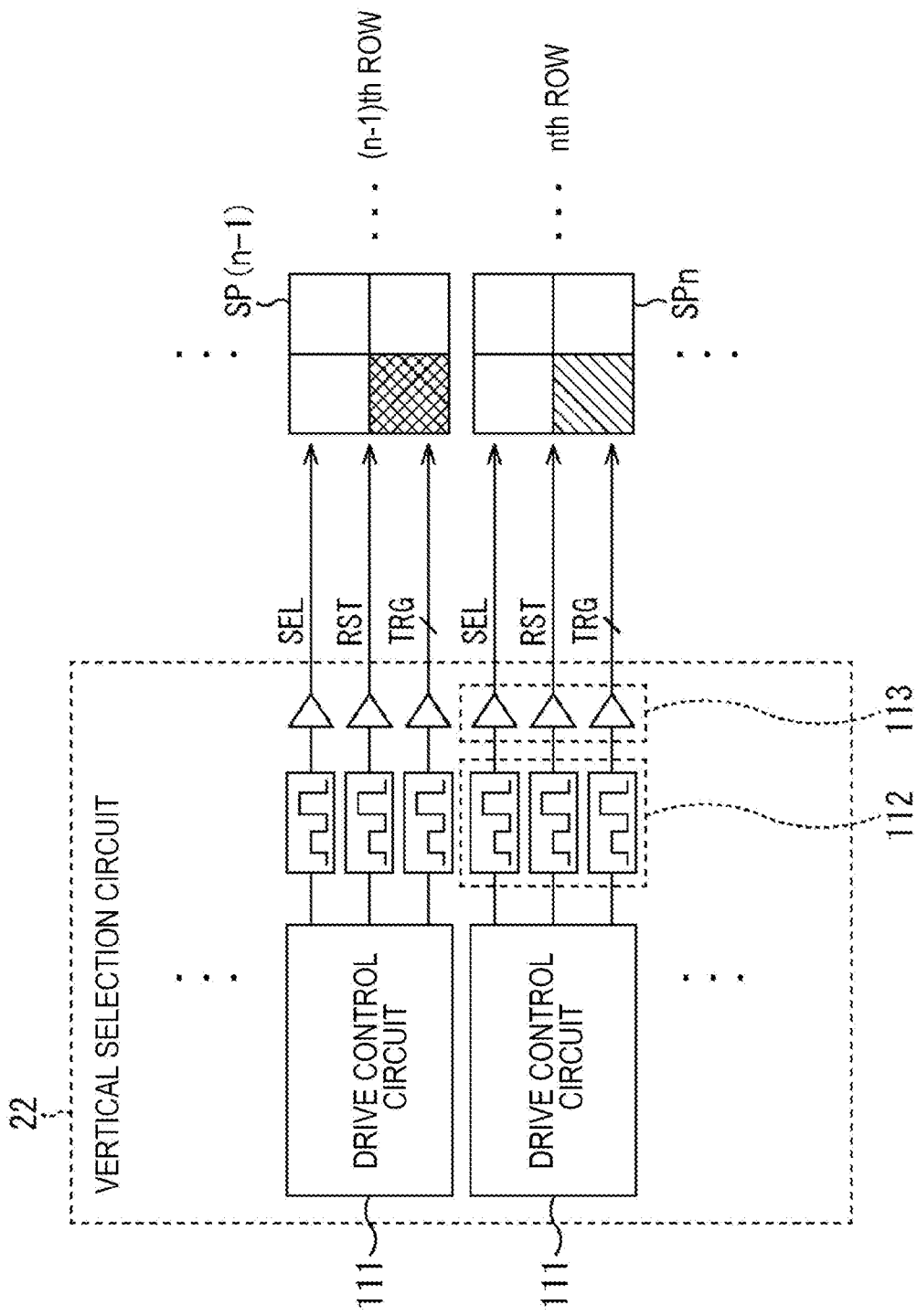
FIG. 4 is a block diagram showing an example configuration of a conventional vertical selection circuit.

FIG. 4 shows a specific example configuration of a conventional vertical selection circuit.

In the vertical selection circuit 22 shown in FIG. 4, drive control circuits 111, level shifters 112, and drivers 113 are provided as the components to drive the shared pixels of the respective shared pixel rows.

The drive control circuits 111 are formed with shift registers or the like. Each drive control circuit 111 supplies the signals for driving a shared pixel (specifically, at least one of the four pixels constituting the shared pixel) included in the corresponding shared pixel row, to the level shifter 112.

The level shifter 112 converts the level of the signal from the drive control circuit 111 in accordance with the function of the driver 113, and supplies the signal to the driver 113.

In accordance with the signal from the level shifter 112, the driver 113 supplies the drive signals TRG, RST, and SEL to the shared pixels of the corresponding shared pixel row via control lines. In the example shown in FIG. 4, four control lines in accordance with the number of the pixels 51 forming each shared pixel are formed as the control lines for supplying the drive signal TRG.

It should be noted that, in the description below, a component formed by combining a drive control circuit 111 ad a level shifter 112 will be referred to as a drive control unit, where appropriate. However, in a case where a drive control circuit 111 is designed to include a level shifter 112, a drive control unit means only a drive control circuit 111.

In FIG. 4, in a case where the shared pixels of the (n−1)th shared pixel row and the nth shared pixel row are simultaneously driven, the drive control units (the drive control circuits 111 and the level shifters 112) and the drivers 113 corresponding to the respective shared pixel rows perform similar operations at the same time.

Example Configuration of a Vertical Selection Circuit of the Present Technology

Figure 5:
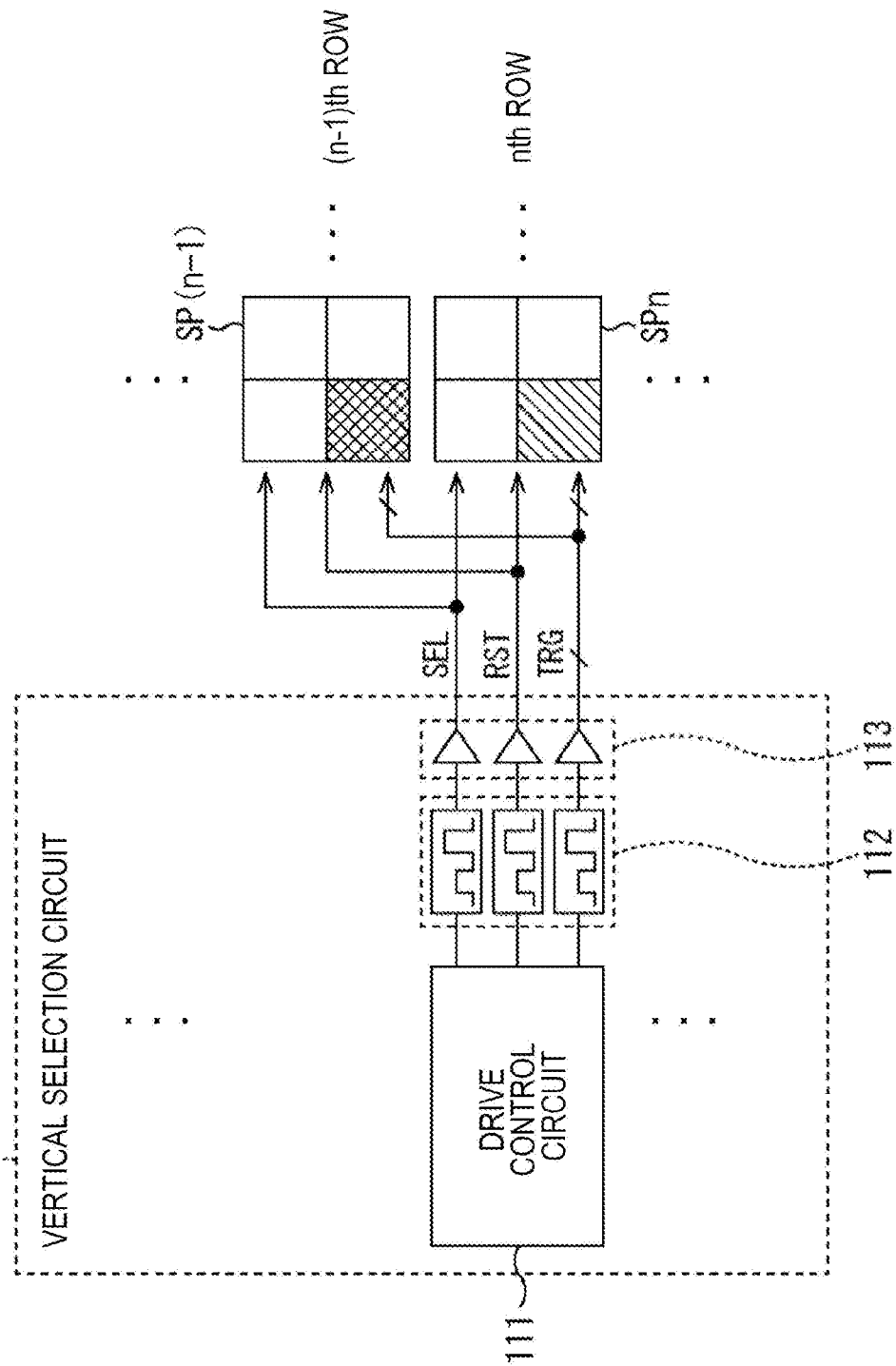
FIG. 5 is a block diagram showing an example configuration of a vertical selection circuit of the present technology.

FIG. 5 shows a specific example configuration of a vertical selection circuit of the present technology. It should be noted that the identical components between the configuration shown in FIG. 5 and the configuration shown in FIG. 4 will not be explained below.

In the vertical selection circuit 22 shown in FIG. 5, a drive control unit is provided for each two shared pixel rows, and operates to simultaneously drive the respective shared pixels of the two shared pixel rows. Then, a driver 113 is also provided for each two shared pixel rows, and simultaneously drives the respective shared pixels of the two shared pixel rows in accordance with a signal from the drive control unit. At this point, the drive control unit supplies signals for driving at least one of the pixels 51 constituting each of the current shared pixels to be driven, to the driver 113.

As described above, drive control units and drivers 113 that perform similar operations at the same time in the configuration shown in FIG. 4 are combined into the drive control unit and the driver 113 shared between the (n−1)th shared pixel row and the nth shared pixel row in the configuration shown in FIG. 5.

In the above described configuration, a drive control unit and a driver are provided for each set of shared pixel rows to be simultaneously driven. Accordingly, it is possible to shrink the vertical selection circuit to a smaller area than that in a configuration in which a drive control unit and a driver are provided for each shared pixel row. In this case, the number of control lines to be formed between the vertical selection circuit and the pixel array can be reduced. Accordingly, it is also possible to shrink the area of the wiring region of the control lines. As a result, the theoretical yield of the chip can be increased.

Also, in the above described configuration, the circuit size of the vertical selection circuit can be made smaller, and thus, the power consumption by the vertical selection circuit can also be reduced.

It should be noted that the above described effect can be enhanced by an increase in the number of shared pixel rows that share a drive control unit and a driver.

<Another Configuration of a Vertical Selection Circuit of the Present Technology>

Figure 6:
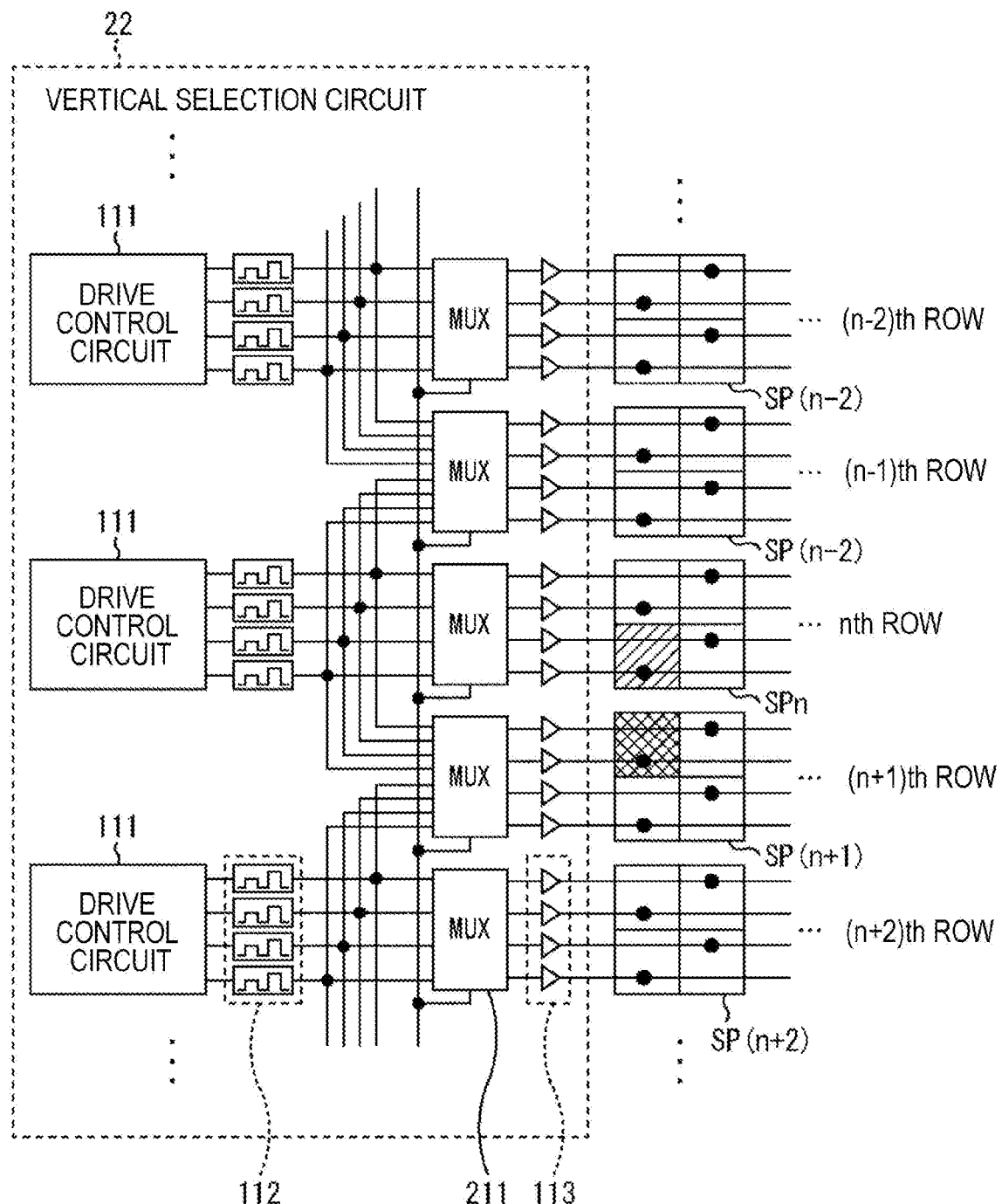
FIG. 6 is a block diagram showing another example configuration of a vertical selection circuit of the present technology.

FIG. 6 shows another example configuration of a vertical selection circuit of the present technology. It should be noted that the identical components between the configuration shown in FIG. 6 and the configuration shown in FIG. 5 will not be explained below.

In the vertical selection circuit 22 shown in FIG. 6, a drive control unit (a drive control circuit 111 and a level shifter 112) is provided for each two shared pixel rows. Meanwhile, a driver 113 is provided for each shared pixel row, and drives the respective shared pixels of the single shared pixel row.

In the vertical selection circuit 22 shown in FIG. 6, multiplexers 211 are further provided between the drive control units (the level shifters 112) and the drivers 113. A multiplexer 211 is provided for each shared pixel row, and is formed as a selection circuit that determines whether to output a signal from the drive control unit. That is, a multiplexer 211 supplies the driver 113 with signals that have been supplied from the drive control unit and are designed for driving at least one of the pixels 51 constituting each of the current shared pixels to be driven, after selecting the output destination.

It should be noted that a drive control unit is designed to supply signals to the multiplexers 211 of shared pixel rows included in certain two shared pixel rows, and to the multiplexer 211 of a shared pixel row included in other two shared pixel rows. For example, the drive control unit of the nth row is connected so as to supply signals to the respective multiplexers 211 of the (n−1)th shared pixel row and the nth shared pixel row, and to the multiplexer 211 of the (n+1)th shared pixel row.

That is, the drive control unit of the nth row can drive the pixels of the (n−1)th shared pixel row, the nth shared pixel row, and the (n+1)th shared pixel row.

It should be noted that the (n−1)th shared pixel row is designed to be also driven by the drive control unit of the (n−2)th row, and the (n+1)th shared pixel row is designed to be also driven by the drive control unit of the (n+2)th row.

In the above described configuration, a drive control unit is provided for each set of shared pixel rows. Accordingly, it is possible to shrink the vertical selection circuit to a smaller area than that in a configuration in which a drive control unit is provided for each shared pixel row. Because of this, the theoretical yield of the chip can be increased, and the circuit size of the vertical selection circuit can be made smaller. Thus, the power consumption by the vertical selection circuit can also be reduced.

Further, multiplexers are provided between the drive control units and the drivers. Accordingly, the degree of freedom in reading pixels can be made higher than that in the configuration shown in FIG. 5.

Figure 7:
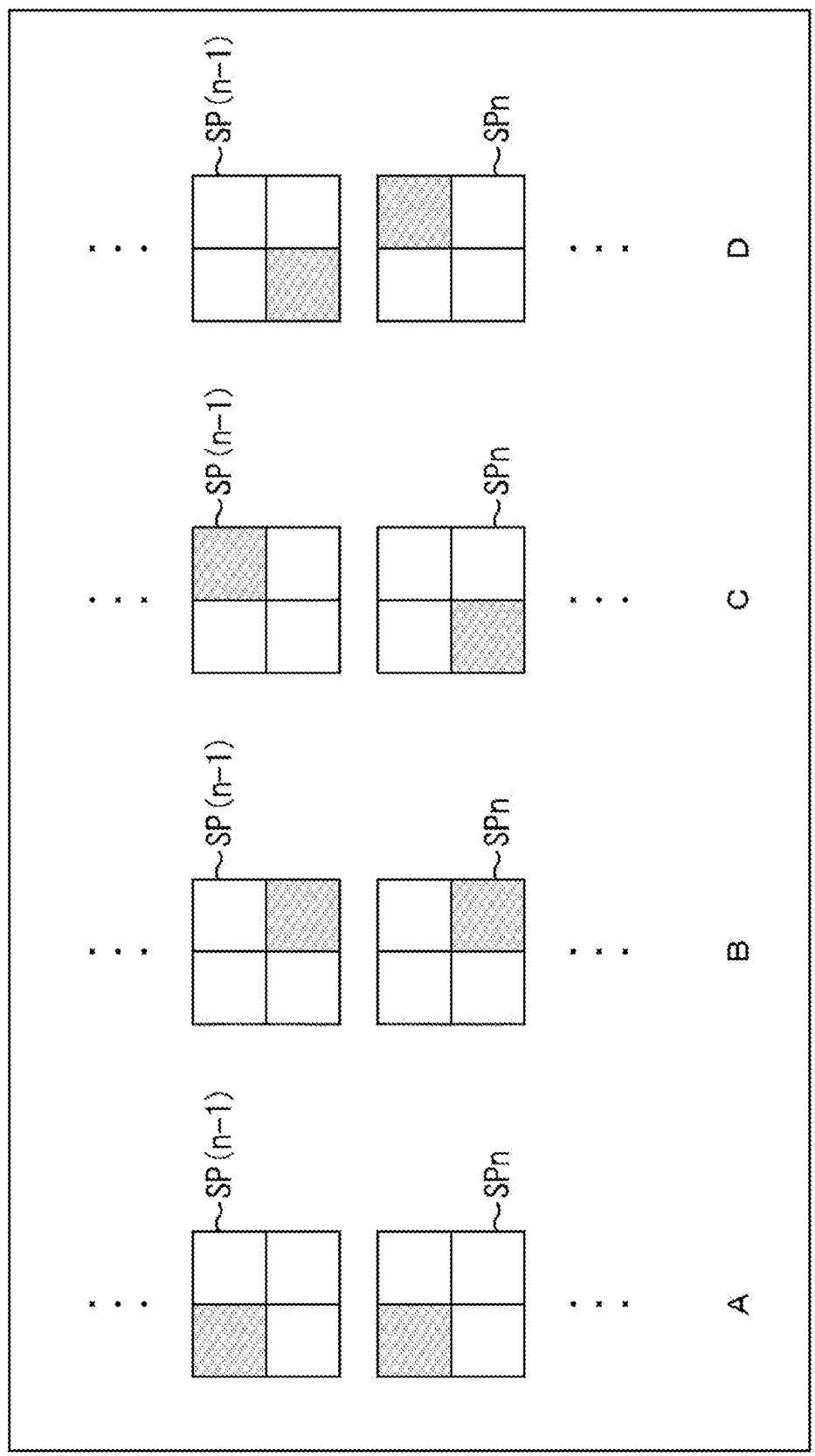
FIG. 7 is a diagram showing examples of pixel reading.

Specifically, as shown in A of FIG. 7 and B of FIG. 7, the upper left one of the four pixels constituting each of shared pixels SP(n−1) and SPn is read, or the lower right one of the four pixels constituting each of the shared pixels SP(n−1) and SPn is read. In this manner, addition reading in the vertical direction can be performed. Further, as shown in C of FIG. 7, the upper right one of the four pixels constituting the shared pixel SP(n−1), and the lower left one of the four pixels constituting the shared pixel SPn are read. In this manner, addition reading in a diagonal direction can be performed. Likewise, as shown in D of FIG. 7, the lower left one of the four pixels constituting the shared pixel SP(n−1), and the upper right one of the four pixels constituting the shared pixel SPn are read. In this manner, addition reading in a diagonal direction can be performed.

Figure 8:
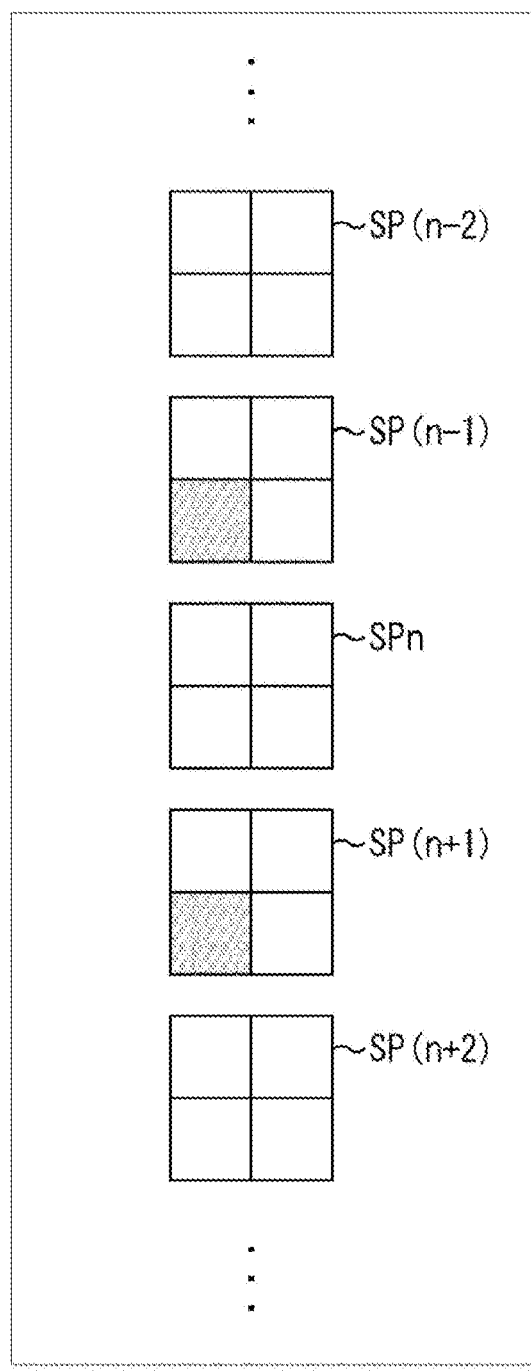
FIG. 8 is a diagram showing an example of pixel reading.

Alternatively, as shown in FIG. 8, among shared pixels SP(n−2), SP(n−1), SPn, SP(n+1), and SP(n+2), only pixels constituting the shared pixels SP(n−1) and SP(n+1) are read. In this manner, decimation reading can be performed.

As the multiplexers are provided between the drive control units and the drivers as described above, reading in a complicated addition mode or decimation reading can be performed.

Also, in the above described configuration, a drive control unit is provided for each two shared pixel rows. However, a drive control unit may be provided for each set of three or more shared pixel rows.

In this case, the same number of A/D converter circuits as the number of shared pixel rows to be simultaneously driven by an operation of a drive control unit are provided for each column in the pixel array.

Also, in the above described configuration, a drive control unit is provided for each set of shared pixel rows. However, the pixels 51 in the pixel array 21 may not constitute shared pixels, and a drive control unit may be provided for each set of pixel rows.

Figure 9:
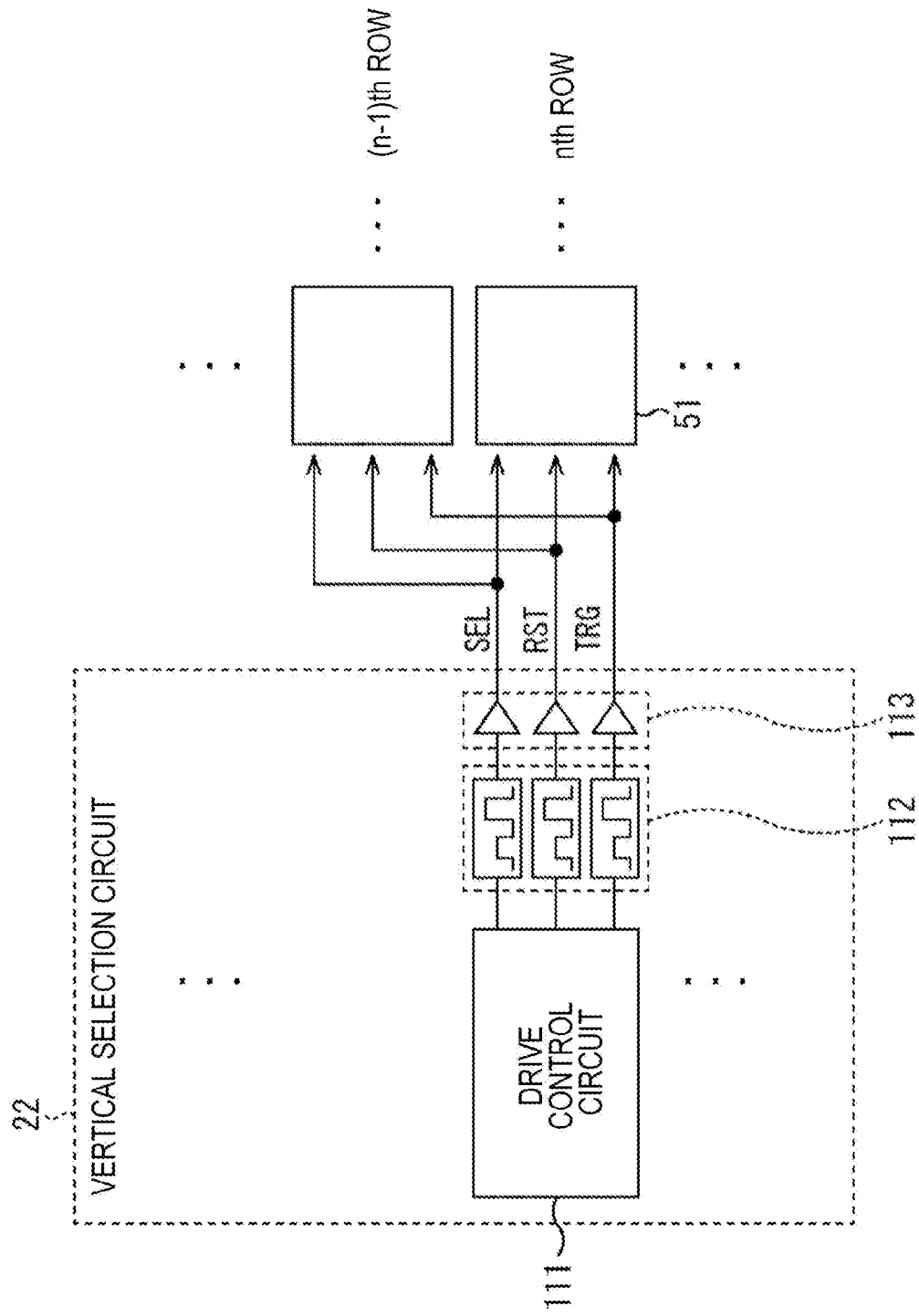
FIG. 9 is a block diagram showing yet another example configuration of a vertical selection circuit according to the present technology.

Yet Another Example Configuration of a Vertical Selection Circuit of the Present Technology FIG. 9 shows yet another example configuration of a vertical selection circuit of the present technology. It should be noted that the identical components between the configuration shown in FIG. 9 and the configuration shown in FIG. 5 will not be explained below.

In the vertical selection circuit 22 shown in FIG. 9, a drive control unit is provided for each two pixel rows, and operates to simultaneously drive the respective pixels of the two pixel rows. Then, a driver 113 is also provided for each two pixel rows, and simultaneously drives the respective pixels of the two pixel rows in accordance with a signal from the drive control unit. At this point, the drive control unit supplies signals for driving the current pixels 51 to be driven, to the driver 113.

As described above, in the configuration shown in FIG. 9, the drive control unit and the driver 113 are shared between the (n−1)th pixel row and the nth pixel row.

In the above described configuration, a drive control unit and a driver are provided for each set of pixel rows to be simultaneously driven. Accordingly, it is possible to shrink the vertical selection circuit to a smaller area than that in a configuration in which a drive control unit and a driver are provided for each pixel row. In this case, the number of control lines to be formed between the vertical selection circuit and the pixel array can also be reduced. Accordingly, it is also possible to shrink the area of the wiring region of the control lines. As a result, the theoretical yield of the chip can be increased.

Also, in the above described configuration, the circuit size of the vertical selection circuit can be made smaller, and thus, the power consumption by the vertical selection circuit can also be reduced.

Figure 10:
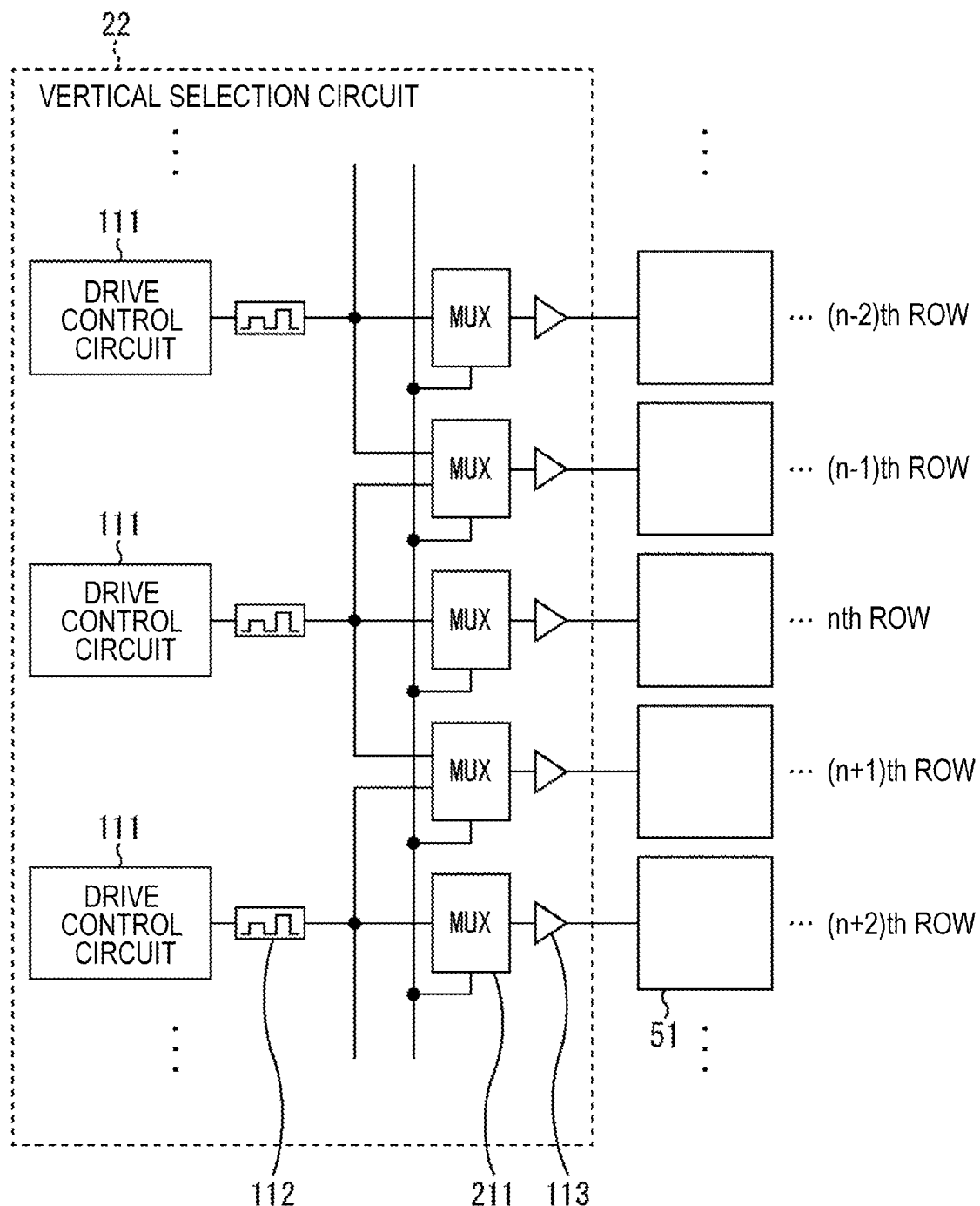
FIG. 10 is a block diagram showing still another example configuration of a vertical selection circuit according to the present technology.

FIG. 10 shows still another example configuration of a vertical selection circuit of the present technology. It should be noted that the identical components between the configuration shown in FIG. 10 and the configuration shown in FIG. 9 will not be explained below.

In the vertical selection circuit 22 shown in FIG. 10, a drive control unit (a drive control circuit 111 and a level shifter 112) is provided for each two pixel rows. Meanwhile, a driver 113 is provided for each pixel row, and drives the respective pixels of the single pixel row.

In the vertical selection circuit 22 shown in FIG. 10, multiplexers 211 are further provided between the drive control units (the level shifters 112) and the drivers 113. A multiplexer 211 is provided for each pixel row, and supplies the driver 113 with signals that have been supplied from the drive control unit and are designed for driving each current pixel 51 to be driven, after selecting the output destination.

It should be noted that a drive control unit is designed to supply signals to the multiplexers 211 of pixel rows included in certain two pixel rows, and to the multiplexer 211 of a pixel row included in other two pixel rows. For example, the drive control unit of the nth row is connected so as to supply signals to the respective multiplexers 211 of the (n−1)th pixel row and the nth pixel row, and to the multiplexer 211 of the (n+1)th pixel row.

That is, the drive control unit of the nth row can drive the pixels of the (n−1)th pixel row, the nth pixel row, and the (n+1)th pixel row.

It should be noted that the (n−1)th pixel row is designed to be also driven by the drive control unit of the (n−2)th row, and the (n+1)th pixel row is designed to be also driven by the drive control unit of the (n+2)th row.

In the above described configuration, a drive control unit is provided for each set of pixel rows. Accordingly, it is possible to shrink the vertical selection circuit to a smaller area than that in a configuration in which a drive control unit is provided for each pixel row. Because of this, the theoretical yield of the chip can be increased, and the circuit size of the vertical selection circuit can be made smaller. Thus, the power consumption by the vertical selection circuit can also be reduced.

Also, in the above described configuration, a drive control unit is provided for each two pixel rows. However, a drive control unit may be provided for each set of three or more pixel rows.

In this case, the same number of A/D converter circuits as the number of pixel rows to be simultaneously driven by an operation of a drive control unit are provided for each column in the pixel array.

Example Configuration of the Substrate of a Solid-State Imaging Device

Figure 11:
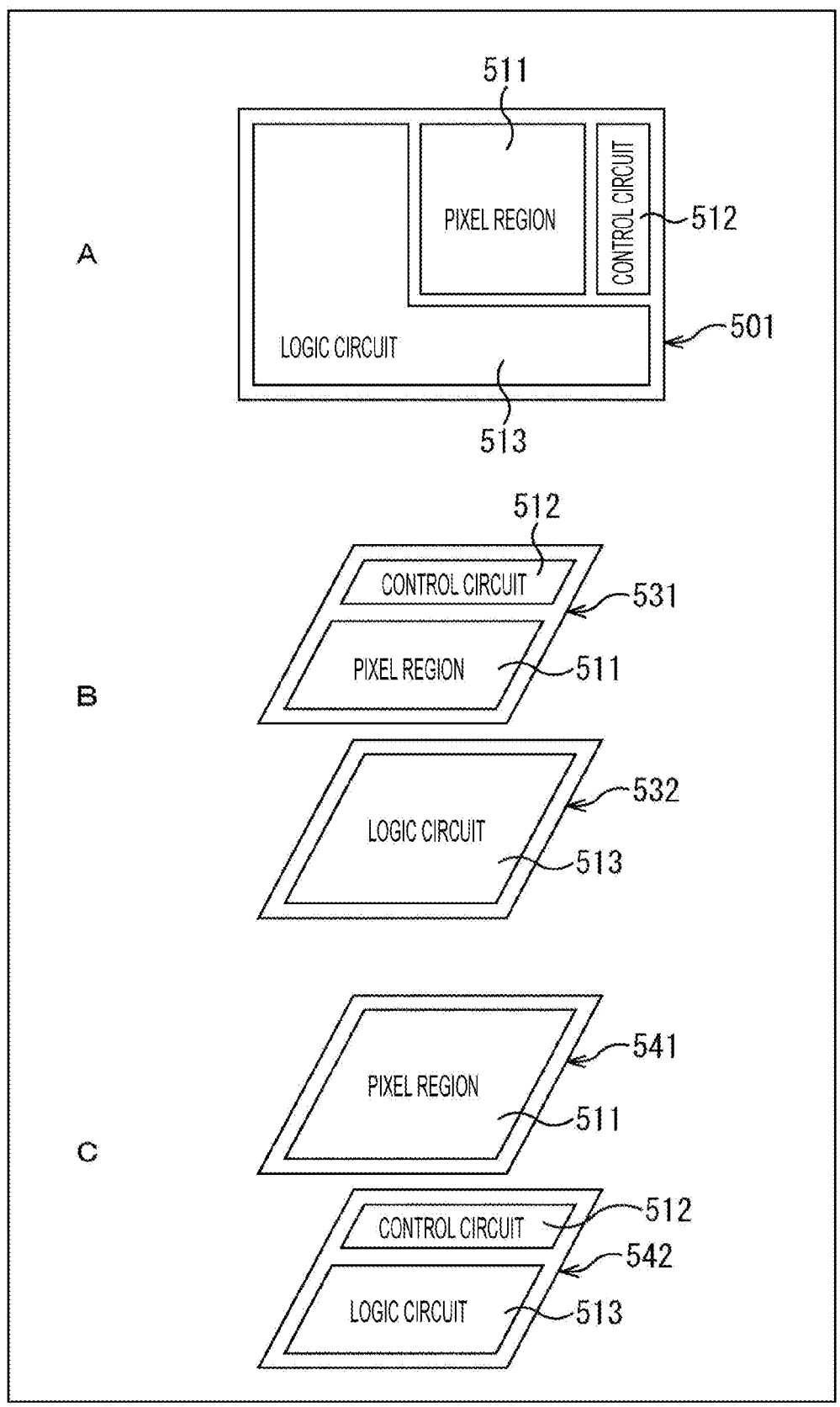
FIG. 11 is a diagram for explaining example configurations of the substrate of a CMOS image sensor.

As shown in A of FIG. 11, the CMOS image sensor 11 shown in FIG. 1 has a configuration in which a pixel region 511 having the pixel array 21 disposed therein, a control circuit 512 that controls the pixels 51, and a logic circuit 513 including a signal processing circuit for pixels signals are formed on a single semiconductor substrate 501.

However, as shown in B of FIG. 11, the CMOS image sensor 11 may be formed with a stack structure in which a first semiconductor substrate 531 having the pixel region 511 and the control circuit 512 formed therein, and a second semiconductor substrate 532 having the logic circuit 513 formed therein are stacked. The first semiconductor substrate 531 and the second semiconductor substrate 532 are electrically connected by a through via or a Cu—Cu metallic bond, for example.

Alternatively, as shown in C of FIG. 11, the CMOS image sensor 11 may be formed with a stack structure in which a first semiconductor substrate 541 having only the pixel region 511 formed therein, and a second semiconductor substrate 542 having the control circuit 512 and the logic circuit 513 formed therein are stacked. The first semiconductor substrate 541 and the second semiconductor substrate 542 are electrically connected by a through via or a Cu—Cu metallic bond, for example.

One of the substrate configurations shown in A of FIG. 11 through C in FIG. 11 may be used as the CMOS image sensor 11 of the above described embodiment.

Particularly, in a case where the vertical selection circuit 22 is formed in a different substrate from the substrate in which the pixel region 511 is formed as shown in B of FIGS. 11 and C of FIG. 11, the number of the through vias connecting the vertical selection circuit 22 to the respective pixel columns can be reduced. As a result, it is possible to shrink the area of the vertical selection circuit, and the theoretical yield of the chip can be increased.

Example Configuration of an Electronic Apparatus

Figure 12:
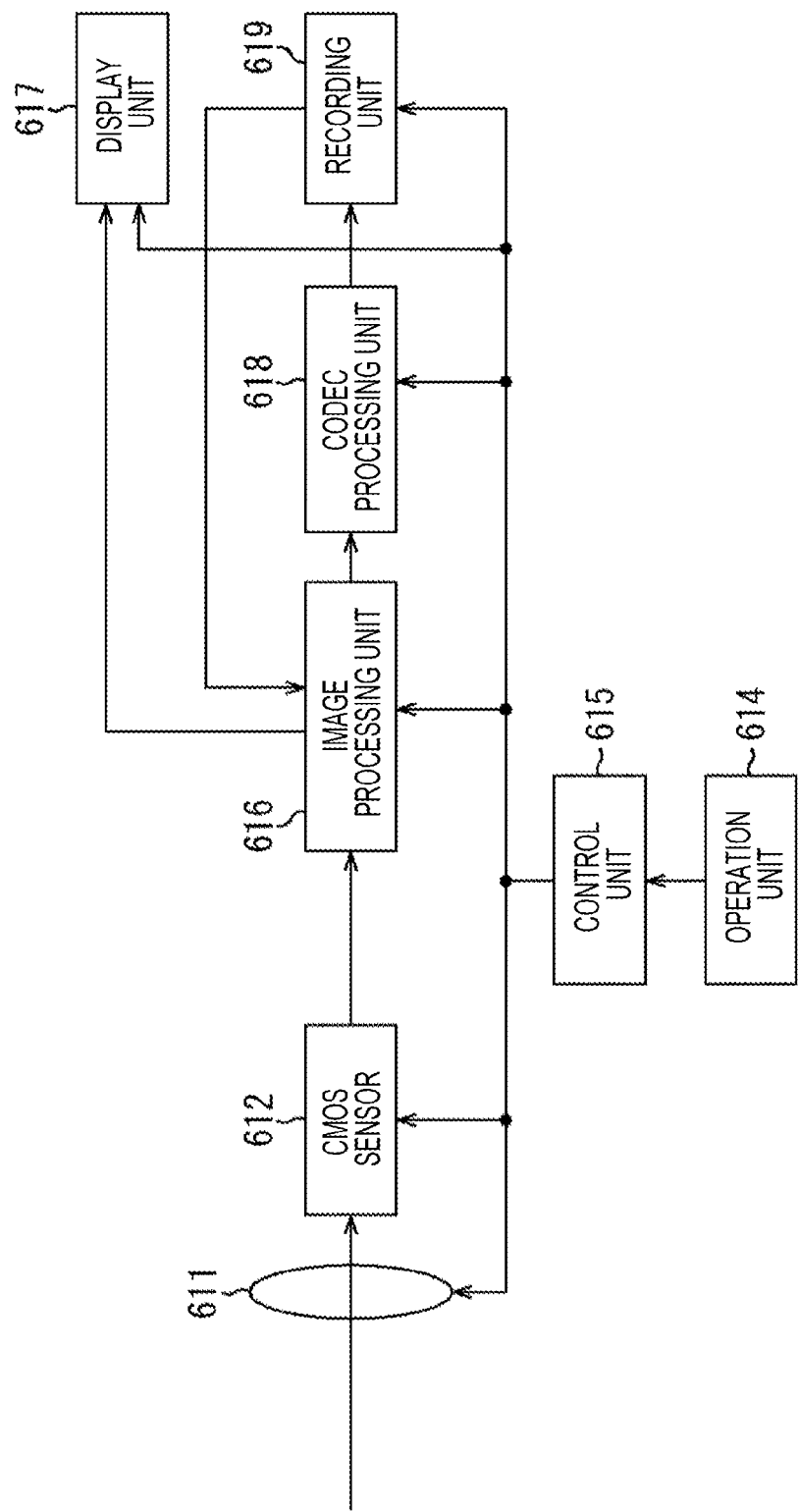
FIG. 12 is a block diagram showing an example configuration of an electronic apparatus according to the present technology.

FIG. 12 is a diagram showing a typical example configuration of an imaging apparatus to which the present technology is applied. The imaging apparatus 601 shown in FIG. 12 is an apparatus that images an object, and outputs an image of the object as an electrical signal.

As shown in FIG. 12, the imaging apparatus 601 includes a lens unit 611, a CMOS sensor 612, an operation unit 614, a control unit 615, an image processing unit 616, a display unit 617, a codec processing unit 618, and a recording unit 619.

The lens unit 611 is formed with optical system elements, such as a lens and a diaphragm. Under the control of the control unit 615, the lens unit 611 adjusts a focus on an object, collects light from the position brought into focus, and supplies the collected light to the CMOS sensor 612.

The CMOS sensor 612 is an image sensor that images an object. Under the control of the control unit 615, the CMOS sensor 612 performs photoelectric conversion on incident light, and performs A/D conversion on the pixel values of the respective pixels, to obtain image data of the object (captured image data). Under the control of the control unit 615, the CMOS sensor 612 supplies the captured image data obtained through the imaging, to the image processing unit 616.

The operation unit 614 is formed with a Jog Dial (a trade name), keys, buttons, a touch panel, and the like, receives an operation input from a user, and supplies a signal according to the operation input to the control unit 615.

In accordance with the signal corresponding to the user's operation input from the operation unit 614, the control unit 615 controls driving of the lens unit 611, the CMOS sensor 612, the image processing unit 616, the display unit 617, the codec processing unit 618, and the recording unit 619, and causes the respective components to perform processing related to imaging.

The image processing unit 616 performs various kinds of image processing, such as black level correction, color mixing correction, defect correction, demosaicing, matrix processing, gamma correction, and YC conversion, on the image signal supplied from the CMOS sensor 612. Any appropriate processing may be performed as this image processing, and processing other than the above may be performed. The image processing unit 616 then supplies the display unit 617 and the codec processing unit 618 with the image signal subjected to the image processing.

The display unit 617 is designed as a liquid crystal display, for example, and displays an image of the object in accordance with the image signal from the image processing unit 616.

The codec processing unit 618 performs an encoding process according to a predetermined method on the image signal from the image processing unit 616, and supplies the image data obtained as a result of the encoding process to the recording unit 619.

The recording unit 619 records the image data supplied from the codec processing unit 618. The image data recorded in the recording unit 619 is read by the image processing unit 616 when necessary, and is supplied to the display unit 617 to display the corresponding image.

The CMOS sensor 612 of the imaging apparatus 601 has a configuration similar to that of the CMOS image sensor 11 described above with reference to FIG. 1. That is, in the CMOS sensor 612, it is possible to shrink the area of the vertical selection circuit, and accordingly, the imaging apparatus 601 can be made smaller in size.

Also, an imaging apparatus including image sensors to which the present technology is applied does not necessarily have the above described configuration, and may have some other configuration.

Further, it should be noted that embodiments of the present technology are not limited to the above-described embodiments, and various modifications may be made to them without departing from the scope of the present technology.

Further, the present technology may also be embodied in the configurations described below.

(1)

A solid-state imaging device including:

a pixel array formed with a plurality of pixels arranged in a matrix; and a drive control unit provided for each set of pixel rows and configured to simultaneously drive pixels included in the set of pixel rows.

(2)

The solid-state imaging device of (1), wherein the drive control unit is provided for each set of shared pixel rows, and operates to simultaneously drive each shared pixel in the set of shared pixel rows.

(3)

The solid-state imaging device of (2), further including a driver provided for each set of shared pixel rows and configured to drive each shared pixel in the set of shared pixel rows in accordance with a signal from the drive control unit.

(4)

The solid-state imaging device of (3), wherein the drive control unit supplies the driver with a signal for driving at least one of pixels constituting the shared pixel.

(5)

The solid-state imaging device of (2), further including:

a selection circuit provided for each shared pixel row and configured to determine whether to output a signal from the drive control unit; and a driver provided for each shared pixel row and configured to drive each shared pixel in the shared pixel row in accordance with the signal from the selection circuit.

(6)

The solid-state imaging device of (5), wherein the selection circuit supplies the driver with a signal for driving at least one of respective pixels constituting the shared pixel.

(7)

The solid-state imaging device of (6), wherein the drive control unit supplies the signal to the selection circuits of the shared pixel rows included in the set of shared pixel rows, and to the selection circuit of a shared pixel row included in another set of shared pixel rows.

(8)

The solid-state imaging device of (1), further including a driver provided for each set of pixel rows and configured to simultaneously drive respective pixels in the set of pixel rows in accordance with a signal from the drive control unit.

(9)

The solid-state imaging device of (1), further including:

a selection circuit provided for each pixel row and configured to determine whether to output a signal from the drive control unit; and a driver provided for each pixel row and configured to drive each pixel in the pixel row in accordance with the signal from the selection circuit, wherein the drive control unit supplies the signal to the selection circuits of the pixel rows included in the set of pixel rows, and to the selection circuit of a pixel row included in another set of pixel rows.

(10)

The solid-state imaging device of any of (1) to (9), further including an A/D converter circuit provided for each column in the pixel array, the number of the A/D converter circuits being the same as the number of the pixel rows to be simultaneously driven by an operation of the drive control unit.

(11)

The solid-state imaging device of any of (1) to (10), wherein a first substrate having the pixel array formed therein and a second substrate having a circuit including the drive control unit formed therein are stacked to form a stack structure.

(12)

An electronic apparatus including a solid-state imaging device including:

a pixel array formed with a plurality of pixels arranged in a matrix; and a drive control unit provided for each set of pixel rows and configured to simultaneously drive respective pixels in the set of pixel rows.

REFERENCE SIGNS LIST

11 CMOS image sensor
21 Pixel array
22 Vertical selection circuit
23-1, 23-2 A/D converter
51 Pixel
111 Drive control circuit
112 Level shifter
113 Driver
211 Multiplexer
531 First semiconductor substrate
532 Second semiconductor substrate
541 First semiconductor substrate
542 Second semiconductor substrate
601 Imaging apparatus
612 CMOS sensor

What is claimed is:

1. A solid-state imaging device comprising:
  a pixel array formed with a plurality of pixels arranged in pixel columns and pixel rows of a matrix;
  a drive control circuit provided for a set of pixel rows and configured to simultaneously drive pixels included in the set of pixel rows, wherein the set of pixel rows includes at least two rows of the pixel rows;
  a first set of control lines electrically connected between the drive control circuit and first pixels in a first pixel row of the at least two rows; and
  a second set of control lines electrically connected between the first set of control lines and second pixels in a second pixel row of the at least two rows, the second pixel row being a different row than the first pixel row,
  wherein the drive control circuit simultaneously drives the first pixels and the second pixels by outputting one or more signals to the first set of control lines for controlling at least one of reset transistors or transfer transistors of the first pixels and the second pixels.

2. The solid-state imaging device according to claim 1, further comprising:
  a driver circuit electrically connected between the drive control circuit and the first set of control lines.

3. The solid-state imaging device according to claim 2, wherein the drive control circuit supplies the driver circuit with the one or more signals for driving the first and second pixels.

4. A solid-state imaging device comprising:
  a pixel array formed with a plurality of pixels arranged in pixel columns and pixel rows of a matrix;
  a drive control circuit provided for a set of pixel rows and configured to simultaneously drive pixels included in the set of pixel rows, wherein the set of pixel rows includes at least two rows of the pixel rows;
  a first set of control lines electrically connected between the drive control circuit and first pixels in a first pixel row of the at least two rows;
  a second set of control lines electrically connected between the first set of control lines and second pixels in a second pixel row of the at least two rows, the second pixel row being a different row than the first pixel row;
  a selection circuit electrically connected between the first set of control lines and the first pixels and configured to determine whether to output the one or more signals from the drive control circuit; and
  a driver circuit electrically connected between the selection circuit and the first pixels,
  wherein the drive control circuit simultaneously drives the first pixels and the second pixels by outputting the one or more signals to the first set of control lines for controlling at least one of reset transistors or transfer transistors of the first pixels and the second pixels.

5. The solid-state imaging device according to claim 4, wherein the selection circuit supplies the driver circuit with the one or more signals for driving the first and second pixels.

6. The solid-state imaging device according to claim 5, wherein the drive control circuit supplies the one or more signals to the selection circuit and to another selection circuit of another set of pixel rows.

7. The solid-state imaging device according to claim 1, further comprising:
- a selection circuit electrically connected between the first set of control lines and the first pixels and configured to determine whether to output the one or more signals from the drive control circuit; and
- a driver circuit electrically connected between the selection circuit and the first pixels and configured to drive the first pixels in accordance with a selection signal of the selection circuit,
- wherein the drive control circuit supplies a control signal to the selection circuit and to another selection circuit of another set of pixel rows.

8. The solid-state imaging device according to claim 1, further comprising:
- an A/D converter circuit provided for each column in the pixel array, the number of the A/D converter circuits being the same as the number of the at least two pixel rows.

9. The solid-state imaging device according to claim 1, wherein a first substrate having the pixel array formed therein and a second substrate having a circuit including the drive control circuit formed therein are stacked to form a stack structure.

10. An electronic apparatus comprising
a solid-state imaging device including:
- a pixel array formed with a plurality of pixels arranged in a matrix; and
- a drive control circuit provided for a set of pixel rows and configured to simultaneously drive respective pixels in the set of pixel rows, wherein each set of pixel rows includes at least two rows of the pixel rows;
- a first set of control lines electrically connected between the drive control circuit and first pixels in a first pixel row of the at least two rows; and
- a second set of control lines electrically connected between the first set of control lines and second pixels in a second pixel row of the at least two rows, the second pixel row being a different row than the first pixel row,
wherein the drive control circuit simultaneously drives the first pixels and the second pixels by outputting one or more signals to the first set of control lines for controlling at least one of reset transistors or transfer transistors of the first pixels and the second pixels.

* * * * *